United States Patent
Koyama et al.

(10) Patent No.: US 9,184,044 B1
(45) Date of Patent: Nov. 10, 2015

(54) METHOD FOR MANUFACTURING SEMICONDUCTOR DEVICE

(71) Applicant: TOYOTA JIDOSHA KABUSHIKI KAISHA, Toyota-shi, Aichi-ken (JP)

(72) Inventors: Takayuki Koyama, Toyota (JP); Takanori Yamamoto, Nagakute (JP); Kenji Nakashima, Nagakute (JP); Takahiro Kozawa, Nagakute (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 14/699,560

(22) Filed: Apr. 29, 2015

(30) Foreign Application Priority Data

Jun. 26, 2014 (JP) ................................. 2014-131022

(51) Int. Cl.
*B44C 1/22* (2006.01)
*H01L 21/02* (2006.01)
*H01L 29/423* (2006.01)
*H01L 29/06* (2006.01)
*H01L 21/311* (2006.01)

(52) U.S. Cl.
CPC .... *H01L 21/02271* (2013.01); *H01L 21/31116* (2013.01); *H01L 29/0634* (2013.01); *H01L 29/4236* (2013.01)

(58) Field of Classification Search
CPC .................................................. H01L 2924/00
USPC ............................................ 216/37; 438/695
See application file for complete search history.

(56) References Cited

U.S. PATENT DOCUMENTS

2005/0221547 A1  10/2005  Yamauchi et al.

FOREIGN PATENT DOCUMENTS

JP     2005317905 A     11/2005

*Primary Examiner* — Roberts Culbert
(74) *Attorney, Agent, or Firm* — Oliff PLC (57) ABSTRACT

A method for manufacturing a semiconductor device is provided with filling a trench by supplying trichlorosilane gas to a substrate where the trench is formed. A relation between a gas concentration of trichlorosilane gas and a film formation speed includes a concentration countergradient condition in which the film formation speed decreases as the gas concentration increases. The filling of the trench is performed under the concentration countergradient condition.

4 Claims, 7 Drawing Sheets

METHOD FOR MANUFACTURING SEMICONDUCTOR DEVICE

CROSS-REFERENCE TO RELATED APPLICATION

This application claims priority to Japanese Patent Application No. 2014431022 filed on Jun. 26, 2014, the contents of which are hereby incorporated by reference into the present application.

TECHNICAL FIELD

The technique disclosed in the present application relates to a method for manufacturing a semiconductor device.

DESCRIPTION OF RELATED ART

For example, a semiconductor device having a trench-type insulating gate or a semiconductor device having a superjunction structure in which p-type columns and n-type columns are arranged alternately, have been developed. Manufacturing such a semiconductor device requires a filling process of filling trenches formed on a substrate by using a chemical vapor deposition technique.

When a semiconductor film is formed in a trench, if a film formation speed of the semiconductor film at an entrance of the trench becomes higher than the same at an inner part of the trench, the entrance of the trench is blocked with the semiconductor film, resulting in formation of a void. Such a void deteriorates electrical characteristics of the semiconductor device.

Japanese Patent Application Publication No. 2005-317905 discloses a technique of filling trenches by supplying two types of reactant gas: feed gas and halide gas, to a substrate. According to this technique, the halide gas works as etching gas, which drops a formation speed of a semiconductor film at an entrance of a trench. As a result, the film formation speed of the semiconductor film at the entrance of the trench becomes lower than the same at the inner part of the trench. This suppresses the blocking of the entrance of the trench with the semiconductor film, thus suppressing the formation of a void in the trench.

BRIEF SUMMARY OF INVENTION

According to the technique of Japanese Patent Application Publication No. 2005-317905, the halide gas must be provided, in addition to the feed gas. This leads to a problem of higher manufacturing costs. This specification sets forth a method for manufacturing a semiconductor device, by which the formation of a void in a trench can be suppressed at low manufacturing costs.

A method for manufacturing a semiconductor device comprises filling a trench by supplying a single type of reactant gas to a substrate where the trench is formed. The reactant gas is of a type which decomposes into a first intermediate contributing to film formation and a second intermediate contributing to etching. A relation between a gas concentration of the reactant gas and a film formation speed includes a concentration countergradient condition in which the film formation speed decreases as the gas concentration increases. The filling of the trench is performed under the concentration countergradient condition.

The reactant gas used in the above manufacturing method is of the type which decomposes into the first intermediate contributing to film formation and the second intermediate contributing to etching. The relation between the gas concentration of such a reactant gas and a film formation speed includes the concentration countergradient condition in which the film formation speed decreases as the gas concentration increases. The filling process is characterized by the use of this concentration countergradient condition. The reactant gas supplied to the substrate vapor-phase diffuses in the trench, where the concentration of the reactant gas is lower at the inner part of the trench than at the entrance of the trench. The reactant gas is consumed first at the entrance of the trench, which results in the concentration of the reactant gas in the trench becoming lower at its inner part than at its entrance. When the filling process is performed under the concentration countergradient condition, therefore, film formation at the inner part of the trench becomes relatively faster, while film formation at the entrance of the trench becomes relatively slower. In this manner, the filling process of the above manufacturing method suppresses the blocking of the entrance of the trench with a semiconductor film, thus suppressing the formation of a void in the trench. The filling process of the manufacturing method uses a single type of reactant gas and does not require another type of etching gas, and therefore results in lower manufacturing costs. The formation of a void in the trench can be suppressed at low costs by executing the above manufacturing method.

DETAILED DESCRIPTION OF INVENTION

Technical features disclosed in this specification are summarized below. Note that matters described below respectively independently have technical utility.

A method for manufacturing a semiconductor device disclosed in this specification may include a filling process of filling trenches. Trenches are needed for various purposes in a process of manufacturing the semiconductor device. For example, trenches are needed for the purpose of forming a trench-type insulating gate or for the purpose of forming a superjunction structure in which p-type columns and n-type columns are arranged alternately. Beside these examples, the method for manufacturing the semiconductor device disclosed in this specification can also be applied, to processes of filling trenches needed for other purposes.

A term "reactant gas" in this specification means gas that chemically reacts on a surface of a substrate, and is used as, for example, a term encompassing gas contributing to a film formation reaction and gas contributing to an etching reaction. A term "feed gas" in this specification means gas containing a material of a semiconductor film formed on the surface of the substrate. Hence the term "reactant gas" is used as a term encompassing the "feed gas".

According to the filling process of the method for manufacturing the semiconductor device disclosed in this specification, a single type of reactant gas may be supplied to the substrate where tranches are formed. In other words, a single type of feed gas is supplied and other types of reactant gas are not supplied. The substrate is typically a semiconductor substrate. Materials for the semiconductor substrate include, for example, a silicon-based material, a silicon-carbide-based material, and a gallium-nitride-based material. The single type of reactant gas supplied to the substrate is of a type which decomposes into a first intermediate contributing to film formation and a second intermediate contributing to etching. This means that although only one type of reactant gas is supplied in the filling process, that reactant gas generates at least the first intermediate contributing to film formation and the second intermediate contributing to etching. For example, when a trench is filled up with silicon, the reactant gas should preferably be of a type which decomposes into silane-based gas contributing to film formation and halide gas contributing to etching. For example, the reactant gas may be trichlorosilane gas. A relation between a gas concentration of the reactant gas and a film formation speed includes a concentration countergradient condition in which the film formation speed decreases as the gas concentration increases. The filling process is performed under the concentration countergradient condition.

A film formation temperature in the filling process may be set in a transitional range between a 'reaction rate determining range' and a 'supply rate determining range'. Setting the film formation temperature in the transitional range increases the film formation speed, allowing the trench to be filled in a short time. Further, the filling process with the film formation temperature set in the transitional range may be performed while the substrate is being rotated. This further increases the film formation speed, thereby allowing the trench to be filled in further shorter time. It should be mentioned herein that the 'reaction rate determining range' means a range where the reaction rate is the major determiner of the overall rate of film formation, while the 'supply rate determining range' means a range where the supply rate is the major determiner of the overall rate of film formation.

Representative, non-limiting examples of the present invention will now be described in further detail with reference to the attached drawings. This detailed description is merely intended to teach a person of skill in the art further details for practicing preferred aspects of the present teachings and is not intended to limit the scope of the invention. Furthermore, each of the additional features and teachings disclosed below may be utilized separately or in conjunction with other features and teachings to provide improved methods for manufacturing a semiconductor device.

Moreover, combinations of features and steps disclosed in the following detailed description may not be necessary to practice the invention in the broadest sense, and are instead taught merely to particularly describe representative examples of the invention. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims, in addition, all value ranges or indications of groups of entities are intended to disclose every possible intermediate value or intermediate entity for the purpose of original written disclosure, as well as for the purpose of restricting the claimed subject matter.

A method for manufacturing a semiconductor device having a trench-type insulating gate will now be described with reference to drawings. The semiconductor device is a power device such as IGBTs or MOSFETs for example. A process of forming the trench-type insulating gate included in the method for manufacturing the semiconductor device will be described below. Processes other than the process of forming the trench-type insulating gate included in the method for manufacturing the semiconductor device, may be executed using known manufacturing techniques.

Figure 1:
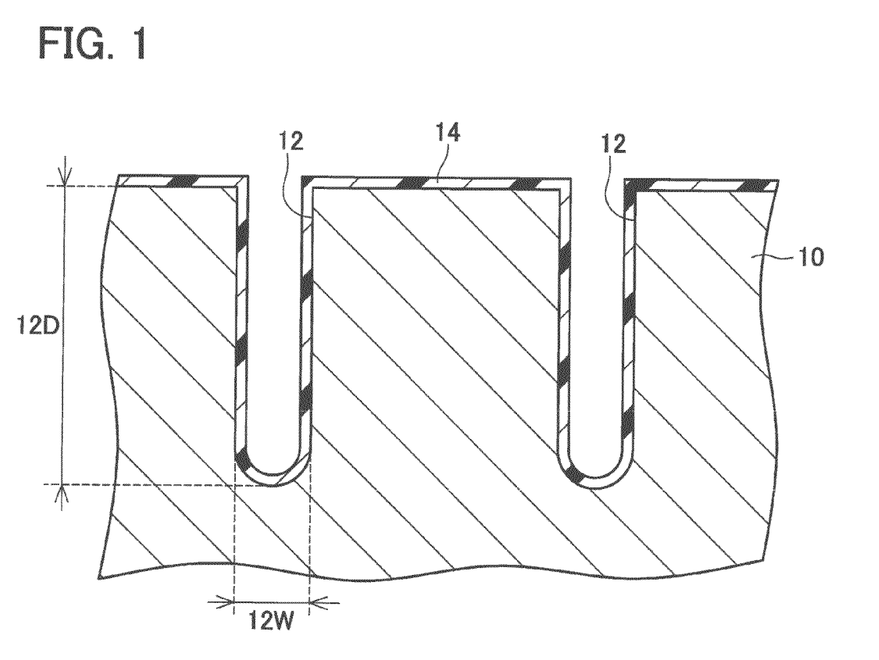
FIG. 1 is a sectional view of a principle part of a semiconductor device, showing a process of manufacturing a trench-type insulating gate.

As shown in FIG. 1, a semiconductor substrate 10 made of silicon single crystal is prepared, which includes a plurality of trenches 12 formed on its main surface. The plurality of trenches 12 is formed on the main surface of the semiconductor substrate 10, using, for example, a reactive ion etching technique. For example, each of the trenches 12 has a width 12W of 1000 nm and a depth 12D of 5000 nm. The main surface of the semiconductor substrate 10 and an inner wall of each trench 12 are covered with a thermal oxide film 14. The thermal oxide film 14 is formed on the main surface of the semiconductor substrate 10 and on the inner wall of the trench 12, using, for example, a thermal oxidation technique. For example, the thermal oxide film 14 is 100 nm in thickness.

Figure 2:
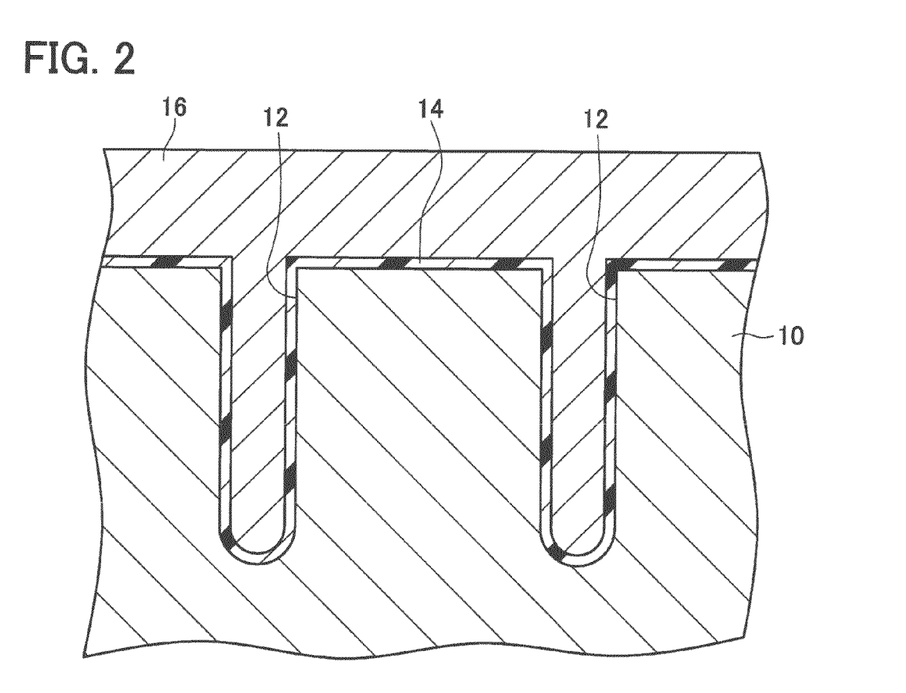
FIG. 2 is a sectional view of the principle part of the semiconductor device, showing the process of manufacturing the trench-type insulating gate.

Subsequently, as shown in FIG. 2, a silicon film 16 is formed in the trenches 12 of the semiconductor substrate 10, using a chemical vapor deposition technique. This is a filling process, which will be described in detail below.

In the filling process, a single type of reactant gas and carrier gas are supplied to the semiconductor device 10. The reactant gas is trichlorosilane gas (($SiHCl_3$) hereinafter, "TCS gas"). The carrier gas is hydrogen gas. When introduced into a reaction chamber of a chemical vapor deposition apparatus, the TCS gas develops a chemical reaction as expressed by the following formula.

$$SiHCl_3 \rightarrow SiCl_2 + HCl$$

$SiCl_2$ represents an intermediate contributing to film formation and HCl represents an intermediate contributing to etching. The above formula indicates that an increase in the concentration of the TCS gas (hereinafter "TCS concentration") leads to an increase in the concentration of $SiCl_2$, which results in an increase in the film formation speed. However, when the TCS concentration becomes higher than a predetermined concentration, the concentration of HCl increases relatively as $SiCl_2$ is consumed. As a result, an etching reaction by HCl and/or a reaction which is reverse to the decomposition expressed by the above formula occurs, which lowers the film formation speed.

Figure 3:
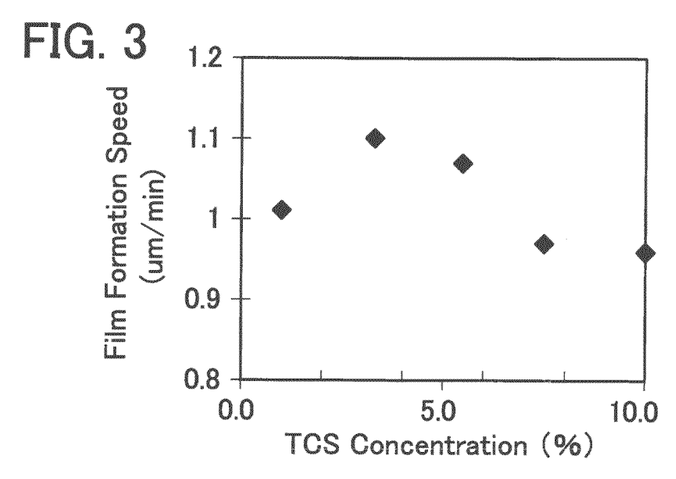
FIG. 3 depicts a relation between a TCS concentration and a film formation speed.

FIG. 3 depicts an example of the relation between the TCS concentration and the film formation speed that results when the silicon film is formed on the silicon substrate with no trench formed thereon. This example is a result of film formation performed under film formation conditions: a film formation temperature is 950° C., a pressure in the reaction chamber is 500 Torr, and a rotating speed of the silicon substrate is 900 rpm.

As shown in FIG. 3, in a range where the TCS concentration is low, the film formation speed of the silicon film increases depending on an increase in the TCS concentration. In a range where the TCS concentration is high enough to exceed about 3%, however, the film formation speed of the silicon film decreases depending on the increase in the TCS concentration. In this manner, in the range where the TCS concentration is higher than about 3%, the TCS gas has a concentration countergradient condition in which the film formation speed decreases as the TCS concentration increases. It has been verified that the TCS gas retains its concentration countergradient condition at film formation temperatures of 850° C. and 1000° C.

Figure 4:
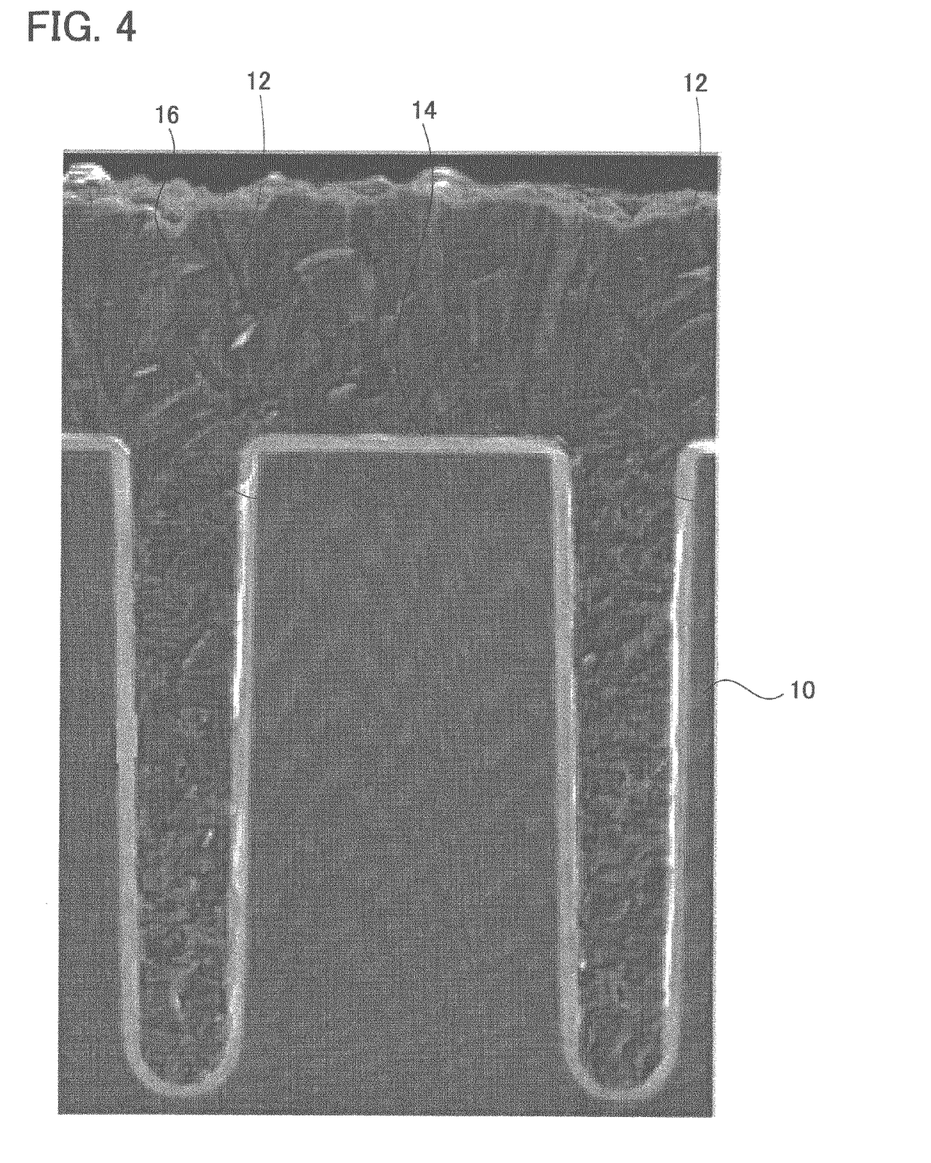
FIG. 4 depicts an electron microscopic photograph of a section of the trench-type insulating gate formed by a manufacturing method of this embodiment.
Figure 5:
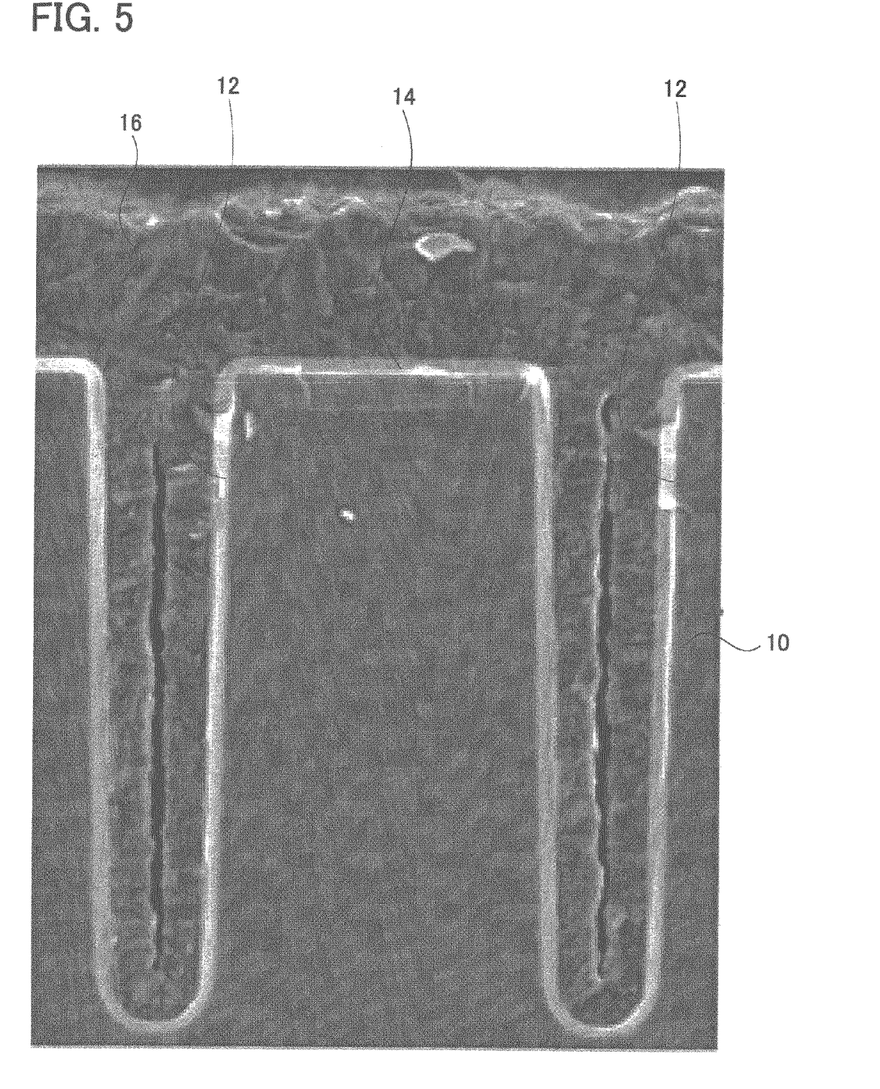
FIG. 5 depicts an electron microscopic photograph of a section of the trench-type insulating gate formed by a manufacturing method of a comparative example.

The filling process of this embodiment is performed under the above concentration countergradient condition. FIG. 4 is a sectional view of the trench-type insulation gate formed by the filling process performed under the concentration countergradient condition. FIG. 5 is a sectional view of the trench-type insulation gate formed by the filling process performed under a condition different from the concentration countergradient condition (hereinafter "concentration normal gradient condition" which is effective in the range where the TCS concentration is low). For example, the concentration countergradient condition is effective when the TCS concentration is 7.5%, the film formation temperature is 950° C., the pressure in the reaction chamber is 500 Torr, and the rotating speed of the semiconductor substrate 10 is 900 rpm. The concentration normal gradient condition is effective when the TCS concentration is 1%, the film formation temperature is 950° C., the pressure in the reaction chamber is 500 Torr, and the rotating speed of the semiconductor substrate 10 is 900 rpm.

The TCS gas supplied to the semiconductor substrate 10 vapor-phase diffuses in each of the trenches 12. As a result, the TCS concentration at an inner part of the trench 12 becomes lower than the same at an entrance of the trench 12. When the filling process is executed under the concentration normal gradient condition, therefore, the TCS concentration which is relatively high at the entrance of the trench 12, leads to a relatively high film formation speed at the entrance, while the TCS concentration which is relatively low at the inner part of the trench 12, leads to a relatively low film formation speed at the inner part. As a result, as shown in FIG. 5, in the trench-type insulating gate formed by the filling process performed under the concentration normal gradient condition, the entrance of the trench 12 is blocked with the silicon film 16, as a result of which a void is formed in the trench 12.

When the filling process is executed under the concentration countergradient condition, in contrast, the TCS concentration which is relatively high at the entrance of the trench 12, leads to a relatively low film formation speed at the entrance, while the TCS concentration which is relatively low at the inner part of the trench 12, leads to a relatively high film formation speed at the inner part. As a result, as shown in FIG. 4, in the trench-type insulating gate formed by the filling process performed under the concentration countergradient condition, the blocking of the entrance of the trench 12 with the silicon film 16 is suppressed, as a result of which the formation of a void in the trench is suppressed.

To ensure that the film formation speed of the silicon film 16 is higher at the inner part of the trench 12 than at the entrance of the trench 12, the TCS concentration need to be controlled so that the concentration countergradient condition is in effect at the entrance as well as at the inner part of the trench 12. For example, the concentration of the TCS gas supplied to the semiconductor substrate 10 should be controlled while a difference in TCS concentration between the entrance and the inner part of the trench 12 is taken into consideration. When the trench 12 has a large aspect ratio, the difference in TCS concentration between the entrance and the inner part of the trench 12 is large. In such a case, the concentration countergradient condition can be held at the inner part of the trench 12 also as a result of TCS concentration control by sufficiently increasing the TCS gas concentration to be supplied to the semiconductor substrate 10. In this embodiment, it is estimated that the aspect ratio of the trench 12 is about 5 and the concentration of the TCS gas to be supplied is about 7.5%, in which case the concentration of the TCS gas at the entrance of the trench is estimated to be about 7% while the same at the inner part of the trench 12 is estimated to be about 4%. It can be accordingly assumed that both of the TCS concentrations are controlled to be within the range where the concentration countergradient condition is effective.

The features of this embodiment will be enumerated below.

(1) The filling process of this embodiment involves supply of only the single type of TCS gas, and therefore requires low manufacturing costs. The filling process of this embodiment, therefore, allows formation of the trenches 12 filled up with the void-free silicon film 16 at low manufacturing costs.

Figure 6:
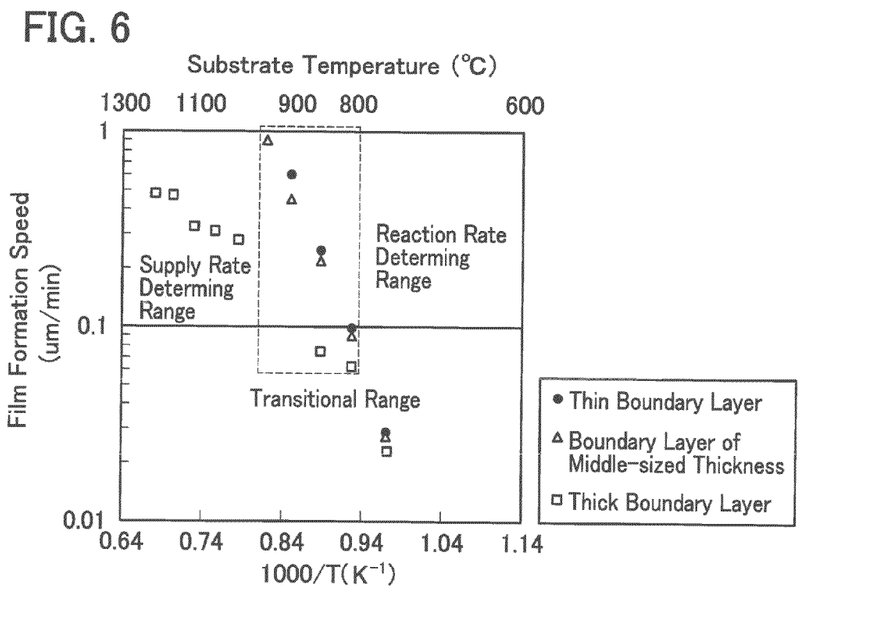
FIG. 6 is a plot (Arrhenius plot) showing dependency of film formation speed on film formation temperature.

(2) For example, when the filling process is performed in a low-temperature range where the film formation temperature is a reaction rate determining temperature, respective film formation speeds at the entrance and the inner part of the trench become equal to each other. As a result, the trench can be filled up with the void-free silicon film. However, the silicon film is very slow to grow in such a low temperature range. Contrary to this, the filling process of this embodiment is performed at the high film formation temperature of 950° C. As shown in FIG. 6, the high film formation temperature of 950° C. belongs to a transitional range between a supply rate determining range and a reaction rate determining range. The filling process of this embodiment sets the film formation temperature in the transitional range, thus offering a feature that the film formation speed of the silicon film is high. FIG. 6 depicts cases where the thickness of a gas boundary layer at the surface of the semiconductor substrate is changed by changing the rotating speed of the semiconductor substrate. "Thin boundary layer" represents a case where the gas boundary layer at the surface of the semiconductor substrate becomes thin when the semiconductor substrate is rotated at a rotating speed of 3000 rpm. "Thick boundary layer" represents a case where the gas boundary layer at the surface of the semiconductor substrate becomes thick when the semiconductor substrate is not rotated. "Boundary layer of middle-sized thickness" represents a case where the gas boundary layer at the surface of the semiconductor substrate has a middle-sized thickness between the thickness of "thin boundary layer" and thickness of "thick boundary layer" as a result of rotation of the semiconductor substrate at a rotating speed of 900 rpm. As observed from FIG. 6, when the film formation temperature is set in the transitional range, thinning the gas boundary layer by increasing the rotating speed of the semiconductor substrate further raises the film formation speed. The filling process in the present embodiment achieves formation of the silicon film at an extremely high speed because the filling process is performed at the film formation temperature set in the transitional range while the semiconductor substrate is being rotated.

Figure 7:
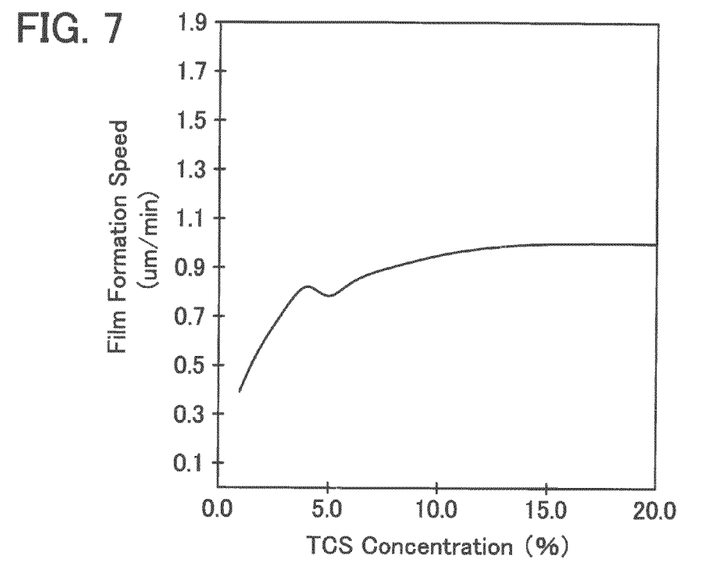
FIG. 7 depicts a simulation result of a TCS concentration and a firm formation speed at a rotating speed of 50 rpm.
Figure 8:
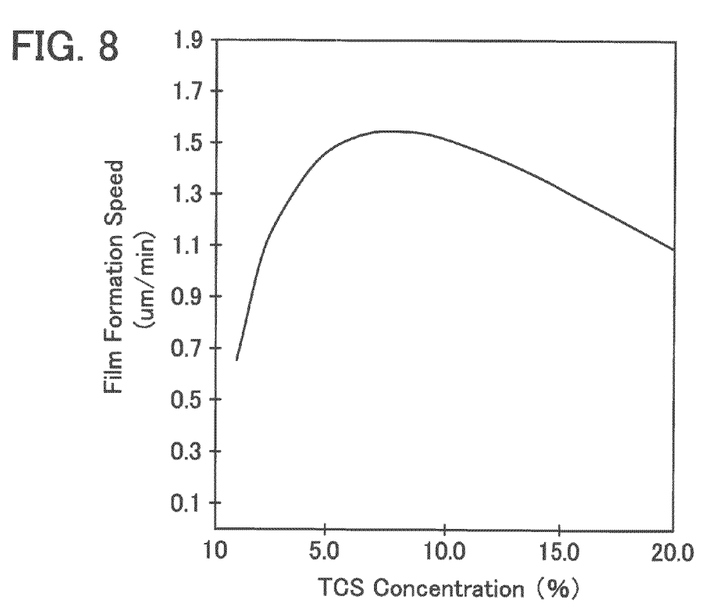
FIG. 8 depicts a simulation result of a TCS concentration and a firm formation speed at a rotating speed of 900 rpm.

(3) FIGS. 7 and 8 depict results of simulation of film formation speeds that result when the rotating speed of the semiconductor substrate is changed. FIG. 7 depicts a film formation speed that results when the rotating speed of the semiconductor substrate is 50 rpm, and FIG. 8 depicts a film formation speed that results when the rotating speed of the semiconductor substrate is 900 rpm. As shown in FIGS. 7 and 8, rotating the semiconductor substrate increases the degree of the concentration countergradient. When the filling process is performed as the semiconductor substrate is rotated, therefore, the film formation speed at the entrance of the trench becomes significantly lower than the same at the inner part of the trench. As a result, the void formation is suppressed effectively and the trench is filled up with the high-quality silicon film.

What is claimed is:

1. A method for manufacturing a semiconductor device, the method comprising:
    filling a trench by supplying a single type of reactant gas to a substrate where the trench is formed, wherein
    the reactant gas is of a type which decomposes into a first intermediate contributing to film formation and a second intermediate contributing to etching,
    a relation between a gas concentration of the reactant gas and a film formation speed includes a concentration countergradient condition in which the film formation speed decreases as the gas concentration increases, and
    the filling of the trench is performed under the concentration countergradient condition.

2. The method for manufacturing a semiconductor device according to claim 1, wherein
    a film formation temperature in the filling of the trench is set in a transitional range between a reaction rate determining range and a supply rate determining range.

3. The method for manufacturing a semiconductor device according to claim 2, wherein
    the filling of the trench is performed in a state where the substrate is being rotated.

4. The method for manufacturing a semiconductor device according to claim 1, wherein
    the reactant gas is trichlorosilane.

* * * * *